United States Patent
Berman et al.

(10) Patent No.: US 7,111,632 B2
(45) Date of Patent: Sep. 26, 2006

(54) ULTRASONIC CLEANING DEVICE FOR REMOVING UNDESIRABLE PARTICLES FROM AN OBJECT

(75) Inventors: Richard Jonathan Berman, Minnetonka, MN (US); Steven Harlow Anderson Axdal, Cottage Grove, MN (US); Allan Ray Holtz, Oakdale, MN (US); Jordan Youdanos Woldu, St. Paul, MN (US)

(73) Assignee: Seagate Technology LLC, Scotts Valley, CA (US)

(*) Notice: Subject to any disclaimer, the term of this patent is extended or adjusted under 35 U.S.C. 154(b) by 236 days.

(21) Appl. No.: 10/667,997

(22) Filed: Sep. 22, 2003

(65) Prior Publication Data

US 2005/0061355 A1 Mar. 24, 2005

(51) Int. Cl.
*B08B 3/12* (2006.01)
(52) U.S. Cl. ............... 134/184; 134/186; 134/155; 134/161
(58) Field of Classification Search ............... 134/155, 134/261, 184, 186, 161
See application file for complete search history.

(56) References Cited

U.S. PATENT DOCUMENTS

| | | | | |
|---|---|---|---|---|
| 4,893,320 | A | * 1/1990 | Yanagi et al. | 377/11 |
| 6,039,055 | A | 3/2000 | Akatsu | 134/1.3 |
| 6,138,698 | A | * 10/2000 | Tanaka et al. | 134/184 |

FOREIGN PATENT DOCUMENTS

| | | | | |
|---|---|---|---|---|
| JP | 05057256 | A2 | 3/1993 | 3/12 |
| JP | 07108240 | A2 | 1/1995 | 3/12 |
| JP | 07096258 | A2 | 4/1995 | 3/12 |
| JP | 11008214 | | * 1/1999 | |
| JP | 11008214 | A2 | 1/1999 | 21/304 |

OTHER PUBLICATIONS

TechBrief, vol. 34, "Liqui-Cel® Membrane Contractors Easily Improve Megasonic Cleaning Performance by Controlling Total Dissolved Gases", Sep. 2002.
Gill, C. B. and Meneer, I. D., "Advances in Gas Control Technology in the Brewery", The Brewer, Feb. 1997.
Mackey, J. and Mojonnier, J., "CO2 Injection Using Membrane Technology", Eighth International Conference on the Operation of Technologically Advanced Beverage Plants and Warehouses, Mar. 1995.
Fuchs, F. J., Handbook of Critical Cleaning, CRC Press LLC, 2001, p. 213.
TechBrief, vol. 44, "Precise Control of Dissolved $O_2$ and $N_2$ in Semiconductor Applications Using Liqui-Cel® Membrane Contactors", Jul. 2003.
Brauwelt International Technical Feature, "Non-dispersive diffusion for nitrogenation", pp. 129-130.

* cited by examiner

*Primary Examiner*—Michael Barr
*Assistant Examiner*—Saeed Chaudhry
(74) *Attorney, Agent, or Firm*—Leanne R. Taveggia; Westman, Champlin & Kelly, P.A.

(57) ABSTRACT

A cleaning device for cleaning an object includes an inner vessel configured to contain a first liquid and the object. The cleaning device also includes an external vessel configured to contain a second liquid and the inner vessel. The second liquid is acoustically coupled to the first liquid. At least one transducer is acoustically coupled to the external vessel and configured to generate acoustical energy which is transferred to the object through the external vessel, a second liquid, the inner vessel and the first liquid. The first liquid has a dissolved gas concentration of a first gas and the second liquid has a dissolved gas concentration of a second gas.

26 Claims, 5 Drawing Sheets

ULTRASONIC CLEANING DEVICE FOR REMOVING UNDESIRABLE PARTICLES FROM AN OBJECT

FIELD OF THE INVENTION

The present invention relates generally to the field of cleaning objects from a variety of industries, and more specifically to a cleaning device that removes undesirable material on an object.

BACKGROUND OF THE INVENTION

Unwanted particles and contaminants can accumulate on the surfaces of workpieces (or objects), such as semiconductor wafers and component parts, in a variety of industries. Undesirable particles are generally introduced to the objects by the external environment. However, frequently, the undesirable particles are introduced as a result of the fabrication of the objects during manufacture. In the field of data storage systems, fabricated disc drive components have become increasingly sensitive to particles and contaminants deposited on the surfaces of component parts. To increase recording density in data storage systems, it has become desirable to reduce the fly height over the data storage media. After assembly of a data storage system and during data storage system operation, serious damage to the data storage media and a loss of data can result if particles become present at the head and data storage media interface. Particles that are present at this interface can cause performance problems such as media defects, thermal asperities, stiction, head crash or catastrophic drive failure.

Acoustic energy, in the ultrasonic and megasonic frequency ranges, is commonly used to clean undesirable material off of component parts. Typically, a cleaning system includes a cleaning bath that holds a wash fluid in which component parts are immersed for cleaning. The wash fluid can contain various chemical solutions as well as various temperatures and dissolved gas concentrations. The cleaning bath has an array of ultrasonic transducers that are coupled to the bottom and/or sides of the bath. The transducers emit an ultrasonic or megasonic frequency which permeates the bath and the bath's wash fluid and cleans the component parts.

The maximum cleaning efficiency of the cleaning bath, however, can be compromised in a single wash fluid cleaning system. Cleaning variables such as time, temperature, power, chemistry, dissolved gas concentration, cleaning bath design and acoustical energy compete for maximum cleaning efficiency. For example, it is known that a lower dissolved gas concentration in a cleaning system increases particle removal, but it has also been demonstrated that some level of dissolved gas is needed to remove particles. In addition, control and use of the above-identified variables increases the amount of energy, time, chemicals, system size and costs needed to power the cleaning system.

SUMMARY OF THE INVENTION

The present invention is directed towards a cleaning device for cleaning an object. The cleaning device includes an inner vessel configured to contain a first liquid and the object. The cleaning device also includes an external vessel configured to contain a second liquid and the inner vessel. The second liquid is acoustically coupled to the first liquid. At least one transducer is acoustically coupled to the external vessel and configured to generate acoustical energy which is transferred to the object through the external vessel, a second liquid, the inner vessel and the first liquid. The first liquid has a dissolved gas concentration of a first gas and the second liquid has a dissolved gas concentration of a second gas.

The present invention is also directed towards a system for controlling a dissolved gas concentration in a liquid. The system includes an inlet configured to receive a supply liquid, having an unknown concentration of dissolved gas, into the system. The system also includes a first exchanger and a second exchanger. The first exchanger is operably coupled to the inlet and configured to degas the supply liquid. The second exchanger is operably coupled to the first exchanger and configured to introduce a predetermined gas concentration to the degassed liquid.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
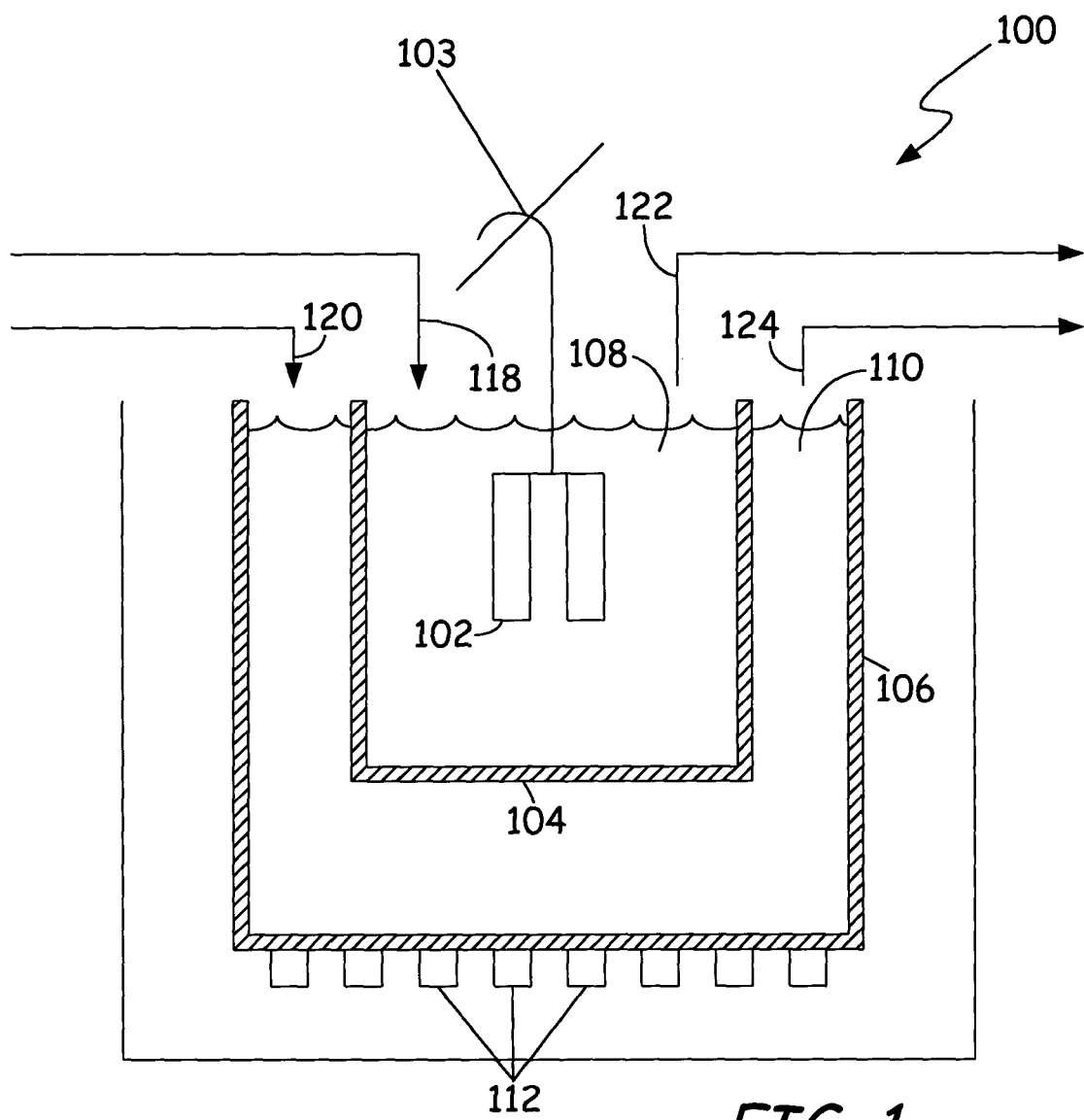
FIG. 1 is a schematic diagram of a cross-sectional view of a cleaning device in accordance with an embodiment of the present invention.

FIG. 1 is a schematic diagram of a cross-sectional view of a cleaning device 100 in accordance with the present invention. Cleaning device 100 is used to remove undesirable particles from component part 102. The component part 102 can be an object from any of a variety of industries. For example, component part 102 is a workpiece, a semiconductor wafer or a disc drive component of a data storage system.

Unwanted particles and contaminants can accumulate on the surfaces of component part 102. These unwanted particles can be introduced to the surfaces of component part 102 from its existing surroundings. However, generally, undesirable particles on the surfaces of component part 102 are a result of its fabrication during manufacture. In the field of data storage systems, fabricated disc drive components have become increasingly sensitive to particles deposited on their surfaces. For example, serious damage to the data storage media and a loss of data can result if particles were to become present at the head and data storage media interface. Particles that are present at this interface can cause performance problems such as media defects, thermal asperities, stiction, head crash or catastrophic drive failure.

In one aspect of the present invention, cleaning device 100 includes an inner vessel 104. Inner vessel 104 comprises an acoustically permeable tank having an open top end. For example, the tank is constructed of glass, metal or any other type of acoustically permeable material. Inner vessel 104 contains a first liquid 108. For example, first liquid 108 can be water, oil, glycol or a solvent. This list of example liquids is not an exhaustive list and first liquid 108 can be made of other liquids. Liquid 108 should be a liquid having low energy transfer ability, but a high capacity for cavitation energy. Although the composition of first liquid 108 will contribute to these desirable features, other physical properties can also contribute. For example, first liquid 108 can have an optimal temperature and flow rate. Inner vessel 104 also contains component part 102. As shown in FIG. 1, component part 102 is supported by support 103.

Cleaning device 100 includes an external vessel 106. External vessel 106 comprises an acoustically permeable tank having an open top end that contains second liquid 110 and inner vessel 104. Inner vessel 104 is proportionally smaller than external vessel 106. Second liquid 110 can comprise the same liquids as first liquid 108. For example, second liquid 110 can be water, oil, glycol or a solvent. This list of example liquids is not an exhaustive list and second liquid 110 can be made of other liquids. Liquid 110 should be a liquid having a high transmissivity for acoustical energy. Although the composition of second liquid 110 will contribute to this desirable feature, other physical properties can also contribute. For example, second liquid 110 can have an optimal temperature and flow rate.

Cleaning device 100 also includes at least one transducer 112 acoustically coupled to external vessel 106. FIG. 1 illustrates transducers 112 coupled to the base of external vessel 106. However, one skilled in the art should recognize that transducers 112 could also be coupled to the sidewalls of external tank 106.

Transducers 112 generate acoustical energy in the ultrasonic and megasonic frequencies. This acoustical energy is transferred to component part 102 through external vessel 106, second liquid 110, inner vessel 104 and first liquid 108.

First liquid 108 has a dissolved gas concentration of a first gas and second liquid 110 has a dissolved gas concentration of a second gas. For example both the first gas and the second gas can be air, pure nitrogen, pure oxygen or other pure gas or combination of gases. This list of example gases is not an exhaustive list. The first gas and the second gas can be any available gas or mixture of gases. The dissolved gas concentration in first liquid 108 is greater than the dissolved gas concentration in second liquid 110. The low dissolved gas concentration in second liquid 110 provides a high capacity for transmissivity of acoustical energy. The high dissolved gas concentration in first liquid 108 provides a high capacity for cavitation energy. In addition, the dissolved gas concentration in first liquid 108 and the dissolved gas concentration in second liquid 110 are substantially constant during application of acoustical energy to component part 102.

To attain a constant dissolved gas concentration in both first liquid 108 and second liquid 110, the flow rates of first liquid 108 and second liquid 110 are balanced and continuously circulated through inner vessel 104 and external vessel 106. As shown in FIG. 1, first liquid 108 enters inner vessel 104 at 118 and second liquid 110 enters external vessel 106 at 120. Also shown in FIG. 1, first liquid 108 exits inner vessel 104 at 122 and second liquid 110 exits external vessel 106 at 124.

Figure 2:
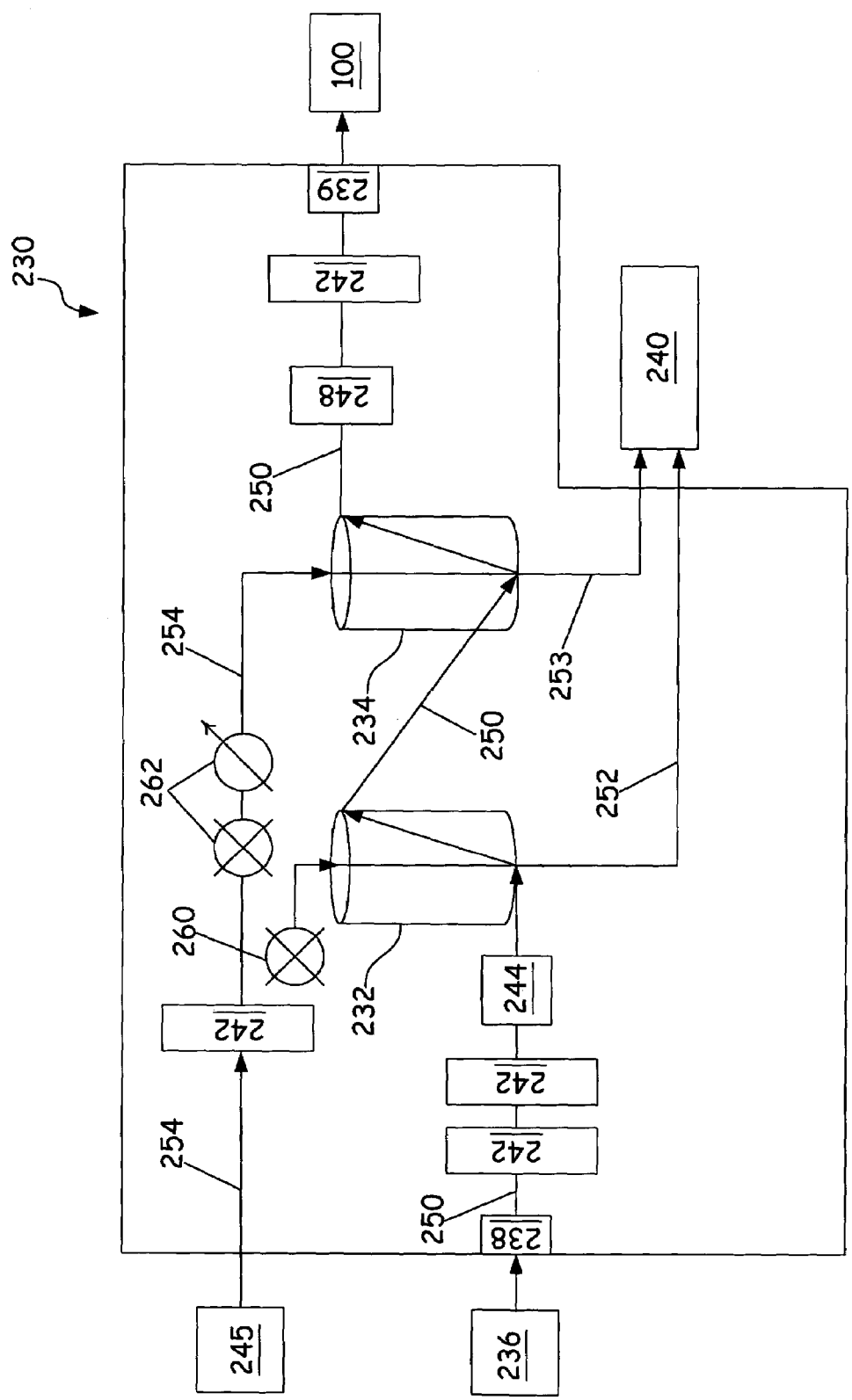
FIG. 2 is a block diagram illustrating a system for controlling a dissolved gas concentration of a liquid in accordance with an embodiment of the present invention.

FIG. 2 is a block diagram illustrating system 230 for controlling a dissolved gas concentration of a liquid in accordance with an embodiment of the present invention. System 230 includes a plurality of control devices 232, 234, 240, 242 and 244. A network of passageways 250, 252, 253 and 254 (illustrated by solid lines) interconnect the control devices 232, 234, 240, 242 and 244.

Supply liquid 236 enters system 230 at inlet 238. At inlet 238, supply liquid 236 has an unknown concentration of dissolved gas. Generally, atmospheric gas will dissolve in liquids, such as water, until equilibrium is reached. Thus, supply liquid 236 has a naturally occurring amount of dissolved gas concentration as it enters system 230. Supply liquid 236 is directed through filters 242 and temperature controller 244. Filters 242 and temperature controller 244 are control devices. Filters 242 remove particles from supply liquid 236 and temperature controller 244 cools or heats supply liquid 236 to a predetermined or desired temperature.

Figure 3:
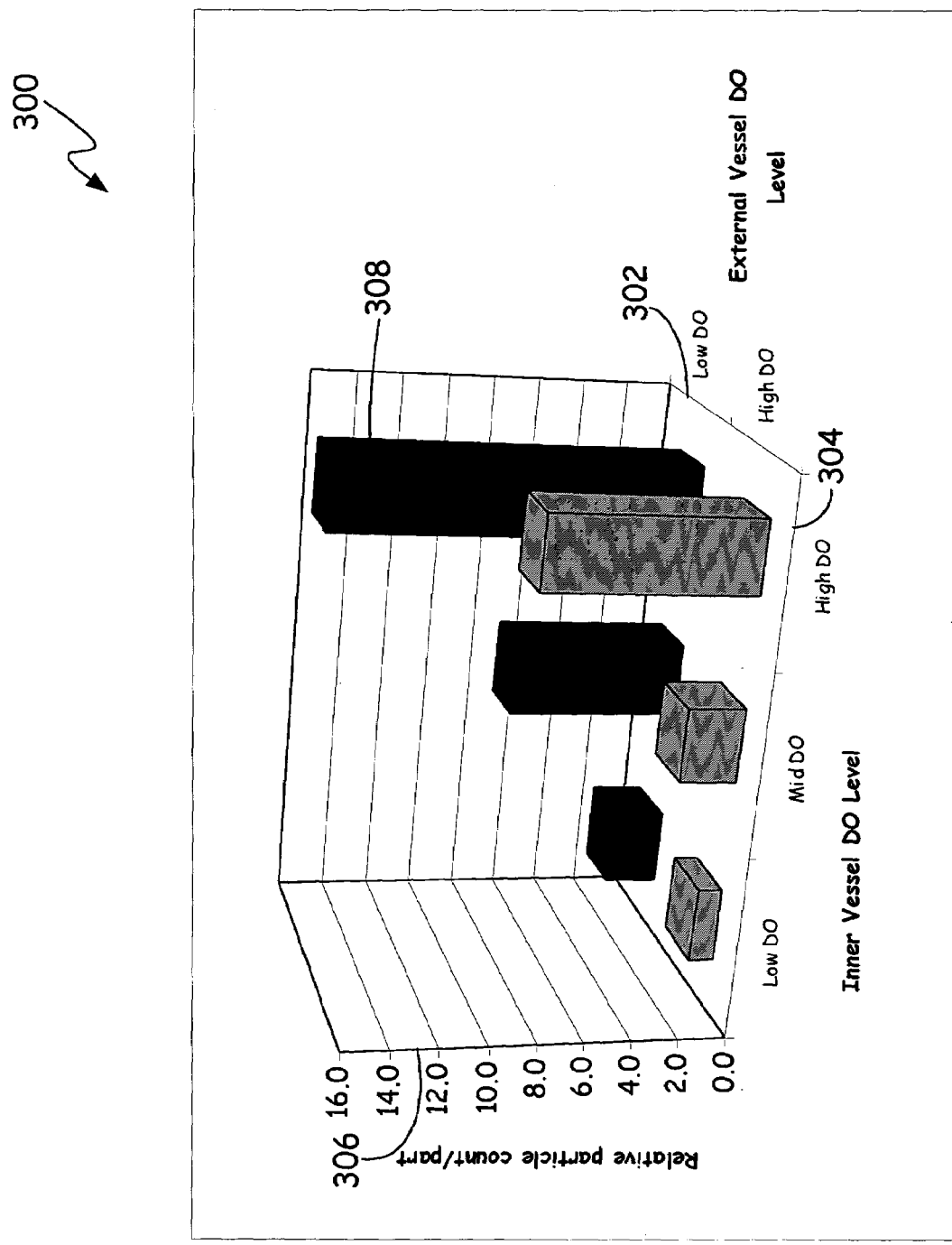
FIG. 3 is a plot showing the particle count of an acoustically cleaned component part with respect to the level of dissolved gas in an inner vessel and an external vessel.

After being filtered and attaining a desired temperature, supply liquid 236 is directed through passageway 250 to first exchanger 232. First exchanger 232 is a control device, which is operably coupled to inlet 238. First exchanger 232 degasses supply liquid 236. For example, first exchanger 232 can be a membrane contactor or the like. Those skilled in the art will recognize, though, that first exchanger 232 can FIG. 2 is a block diagram illustrating a system for controlling a dissolved gas concentration of a liquid in accordance with an embodiment of the present invention. FIG. 3 is a plot showing the particle count of an acoustically cleaned component part with respect to the level of dissolved gas in an inner vessel and an external vessel, be any type of exchanger that can strip dissolved gas from a liquid. First exchanger 232 is operably coupled to vacuum 240 through passageway 252. As illustrated in FIG. 2, vacuum 240 is a dual port vacuum. Those skilled in the art will recognize that device 240 can be an aspirator, an eductor, a diaphragm pump or the like. With valve 260 in a closed position, vacuum 240 creates a vacuum in first exchanger 232. The applied vacuum is the driving force in removing the dissolved gas from supply liquid 236.

Supply liquid 236 exits first exchanger 232 degassed and is directed through passageway 250 to second exchanger 234. Second exchanger 234 is a control device, which is operably coupled to first exchanger 232 and outlet 239. Second exchanger 234 introduces a predetermined or desired concentration of gas to the degassed supply liquid 236. For example, second exchanger 234 can be a membrane contactor or the like. Those skilled in the art will recognize that second exchanger 234 can be any type of exchanger as long as second exchanger 234 dissolves gas into a liquid at a desired concentration. Second exchanger 234 is coupled to supply gas 245 through passageway 254 by setting valve 262 to an open position. Second exchanger 234 is also operably coupled to vacuum 240 through fluid passageway 253. Filter 242 removes unwanted particles from supply gas 245 before supply gas 245 enters second exchanger 234. Valve 262 is configured to allow only enough supply gas 245 through passageway 254 such that supply liquid 236 will attain the predetermined or desired concentration of dissolved gas. Those skilled in the art will recognize that vacuum 240 is pulling gas through both passageways 252 and 253 and thus contains two vacuum ports. It should be noted that system 230 can also utilize two separate vacuums. A first vacuum can be coupled to passageway 252 and a second vacuum can be coupled to passageway 253 in order to pull gas through passageways 252 and 253.

Supply liquid 236 exits second exchanger 234 having the predetermined concentration of dissolved gas and is directed through passageway 250 to filter 242.

Filter 242 is a control device and filters any remaining particles in supply liquid 245.

In addition, flow meter 248 measures the flow rate of supply liquid 245 as it exits system 230 at outlet 239 into cleaning device 100.

FIG. 3 illustrates plot 300 comparing the amount of particles removed from a component part, such as a top cover of a data storage system, versus the level of dissolved oxygen in the inner vessel and in the external vessel. Z-axis 306 shows the amount of particles removed from a component part. X-axis 304 shows an inner vessel, such as inner vessel 104 of FIG. 1, at low, mid and high levels of dissolved oxygen. Y-axis 302 shows an external vessel, such as external vessel 106 of FIG. 1, at low and high levels of dissolved oxygen. The experimental data gathered for plot 300 utilized water for the first liquid and the second liquid. Also, the experimental data gathered for plot 300 utilized air for the first gas and the second gas. It should be recognized that atmospheric air substantially comprises both nitrogen and oxygen.

However, for experimental purposes, plot 300 gathered data according to the measured amount of dissolved oxygen in the first liquid and in the second liquid.

Figure 4:
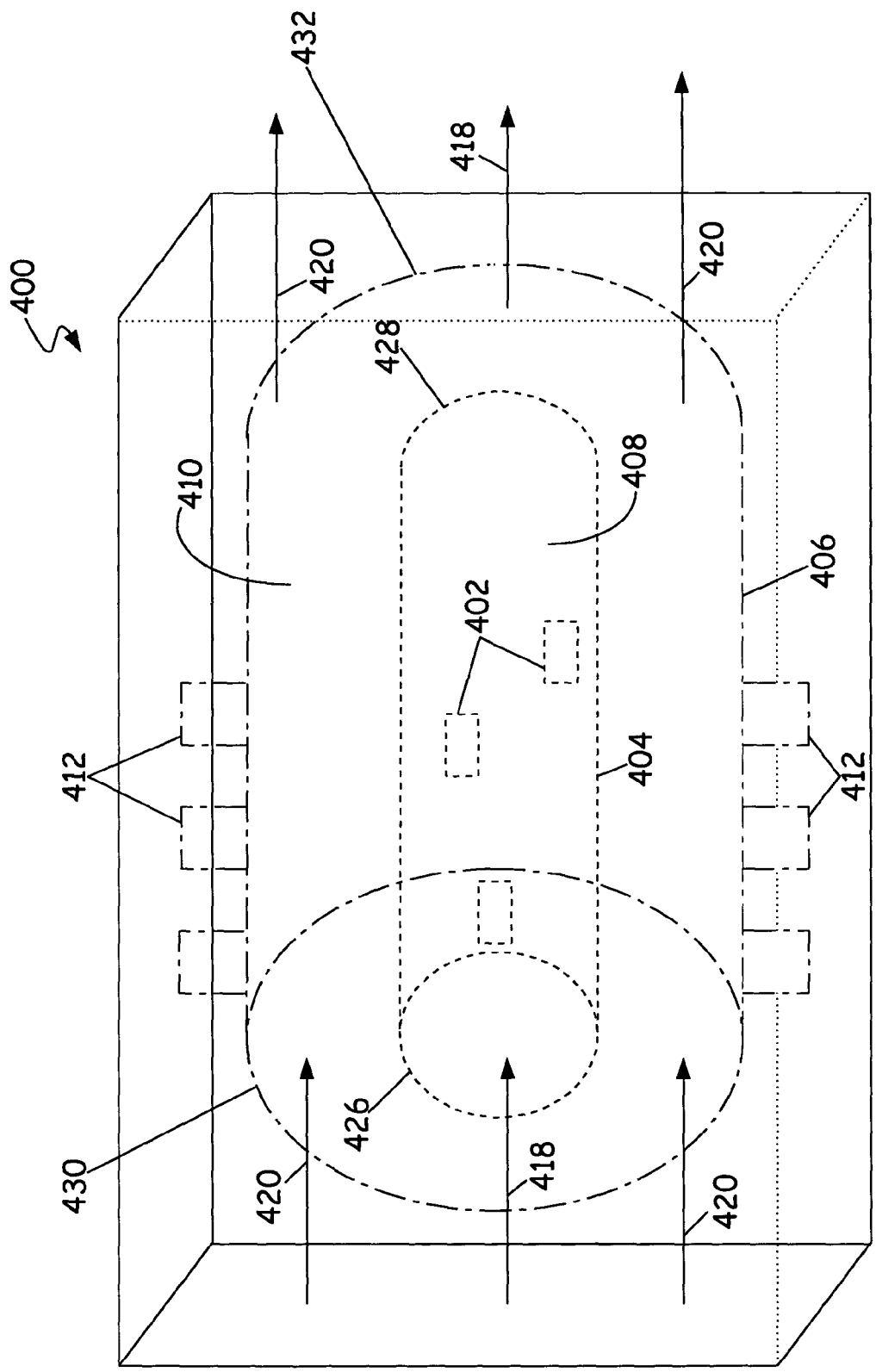
FIG. 4 is a schematic diagram of a perspective view of a cleaning device in accordance with an embodiment of the present invention.

By experimentally varying the levels of dissolved oxygen in the first liquid of the inner vessel and the second liquid of the external vessel, an optimal level of dissolved gas concentration in each of the vessels was determined. Bar 308 of plot 300 represents the largest particle removal from a component part. In order to remove the most particles from the two-vessel cleaning device configuration, the first liquid of the inner vessel has a relatively high dissolved gas concentration and the second liquid of the external vessel has a relatively low dissolved gas concentration. FIG. 4 illustrates a schematic diagram of a perspective view of cleaning device 400 in accordance with an embodiment of the present invention. In another aspect of the present invention, cleaning device 400 is used to remove undesirable particles from at least one component part 402. Component part 402 can be an object from any of a variety of industries. For example, component 402 is a workpiece, a semiconductor wafer or a fabricated disc drive component of a data storage system.

Cleaning device 400 includes an inner conduit 404. Inner conduit 404 comprises an acoustically permeable vessel having a first end 426 and a second end 428. For example, the acoustically permeable vessel is constructed of glass, metal or any other type of acoustic permeable material. Inner conduit 404 contains a first liquid 408. For example, first liquid 408 can be water, oil, glycol or a solvent. This list of example liquids is not an exhaustive list and first liquid 408 can be made of other liquids. Inner conduit 404 also contains at least one component part 402 which is supported by first liquid 408.

Cleaning device 400 includes an external conduit 406. External conduit 406 comprises an acoustically permeable vessel having a first end 430 and a second end 432. External conduit 406 contains second liquid 410 and inner conduit 404 which is supported by second liquid 410. Inner conduit 404 is proportionally smaller than external conduit 406. Second liquid 410 can comprise the same liquid as first liquid 408. For example, second liquid 410 can be water, oil, glycol or solvent. This is not an exhaustive list of example liquids and second liquid 408 can be made of other liquids.

Cleaning device 400 also includes at least one transducer 412 acoustically coupled to the external conduit 406. FIG. 4 illustrates transducers 412 coupled to the external circumference of external conduit 406. Transducers 412 generate acoustical energy in the ultrasonic and megasonic frequencies. This acoustical energy is transferred to at least one component 402 through external conduit 406, second liquid 410, inner conduit 404 and first liquid 408.

First liquid 408 has a dissolved gas concentration of a first gas and second liquid 410 has a dissolved gas concentration of a second gas. For example, both the first gas and the second gas can be air, pure nitrogen, pure oxygen or other pure gas or combination of gases. This list of example gases is not an exhaustive list. The first gas and the second gas can be any other available gas or mixtures of gases. The dissolved gas concentration in first liquid 408 is greater than the dissolved gas concentration in second liquid 410. The low dissolved gas concentration in second liquid 410 provides a high capacity for transmissivity of acoustical energy. The high dissolved gas concentration in first liquid 408 provides a high capacity for cavitation energy. In addition, the dissolved gas concentration of first liquid 408 and the dissolved gas concentration of second liquid 410 are substantially constant during application of acoustical energy to component 402.

To attain a constant dissolved gas concentration in both the first liquid 408 and the second liquid 410, the flow rates of first liquid 408 and second liquid 410 are balanced and continuously circulated through inner conduit 404 and external conduit 406. As shown in FIG. 4, first liquid 408 flows through inner conduit 404 in a direction 418. First liquid 408 transfers the at least one component 402 through inner conduit 406 from first end 426 to second end 428. Second liquid 410 flows through external conduit 406 in a direction 420 from first end 430 to second end 432. Although FIG. 4 illustrates first liquid 408 flowing in direction 418 and second liquid 410 flowing in direction 420, one skilled in the art should recognize that liquid 408 and liquid 410 can flow in a direction opposite of directions 418 and 420. It also should be recognized that first liquid 408 could flow in a direction opposite of second liquid 410.

Figure 5:
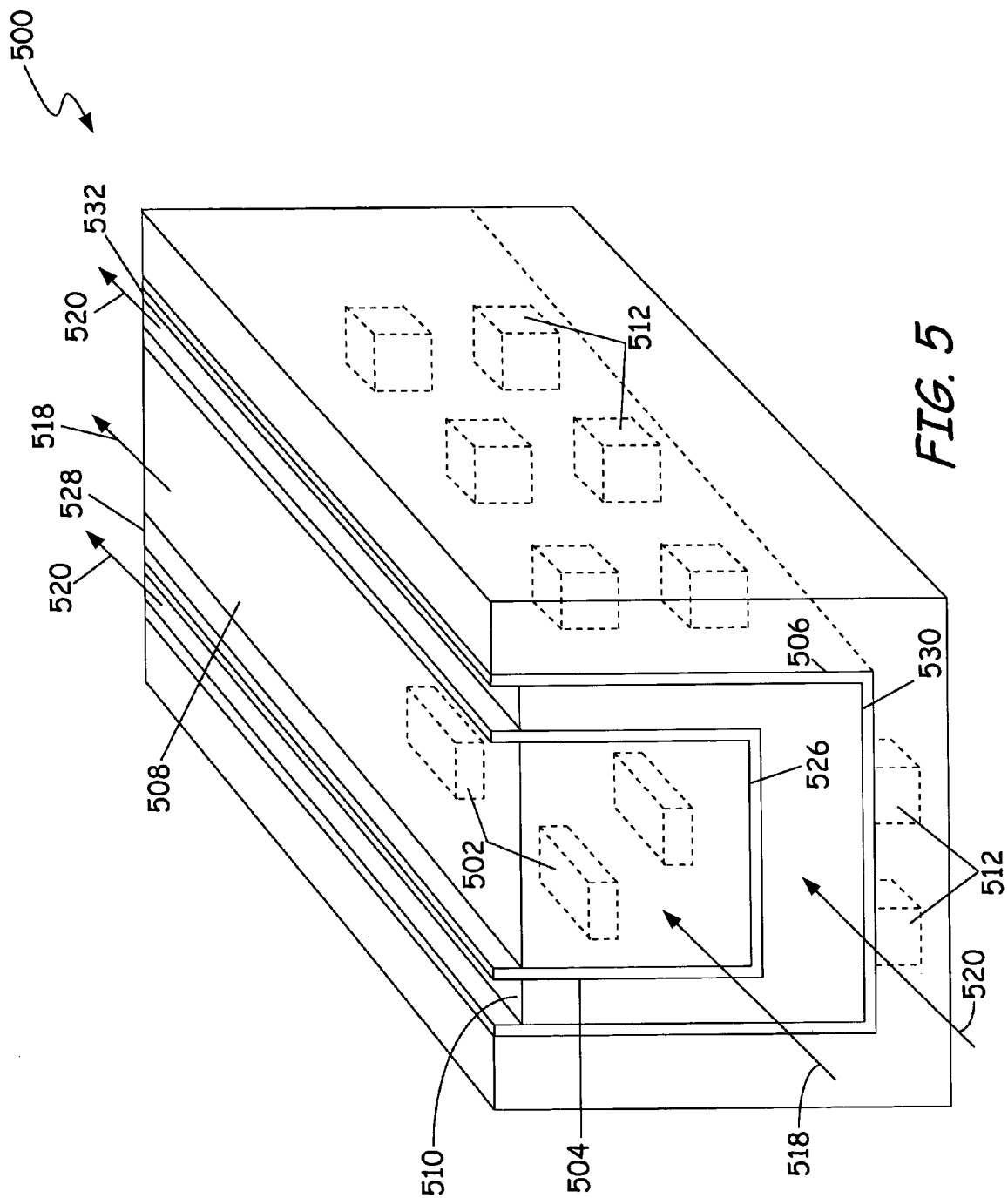
FIG. 5 is a schematic diagram of a perspective view of a cleaning device in accordance with an embodiment of the present invention.

FIG. 5 illustrates a schematic diagram of a perspective view of a cleaning device 500 in accordance with an embodiment of the present invention. In yet another aspect of the present invention, cleaning device 500 is used to remove undesirable particles from at least one component part 502. Component part 502 can be an object from any of a variety of industries. For example, component part 502 is a workpiece, a semiconductor wafer or a fabricated disc drive component of a data storage system.

Cleaning device 500 includes an inner channel 504. Inner channel 504 comprises an acoustically permeable vessel having an open top end. For example, the acoustically permeable vessel is constructed of glass, metal or any other type of acoustically permeable material. Inner channel 504 contains a first liquid 508. For example, first liquid 508 can be water, oil, glycol or a solvent. This list of example liquids is not an exhaustive list and first liquid 508 can be made of other liquids. Inner channel 504 also contains component part 502 which is supported by first liquid 508.

Cleaning device 500 includes an external channel 506. External channel 506 has an open top end that contains second liquid 510 and inner channel 504 which is supported by second liquid 510. Inner channel 504 is proportionally smaller than external channel 506. Second liquid 510 can comprise the same liquid as first liquid 408. For example, second liquid 510 can be water, oil, glycol or solvent. This list of example liquids is not an exhaustive list and second liquid 510 can be made of other liquids.

Cleaning device 500 also includes at least one transducer 512 acoustically coupled to external channel 506. FIG. 5 illustrates at least one transducer 512 coupled to the base and sidewalls of external channel 506. Transducers 512 generate acoustical energy in the ultrasonic and megasonic frequencies. This acoustical energy is transferred to the at least one component part 502 through external channel 506, second liquid 510, inner vessel 504 and first liquid 508.

First liquid 508 has a dissolved gas concentration of a first gas and second liquid 510 has a dissolved gas concentration of the second gas. For example, both the first gas and the second gas can be air, pure nitrogen, pure oxygen or other pure gas or combination of gases. This list of example gases is not an exhaustive list. The first gas and the second gas can be other available gases or a mixture of gases. The dissolved gas concentration in first liquid 508 is greater than the dissolved gas concentration in second liquid 510. The low dissolved gas concentration in second liquid 510 provides a high capacity for transmissivity of acoustical energy. The high dissolved gas concentration in first liquid 508 provides a high capacity for cavitation energy. The dissolved gas concentration in first liquid 508 and the dissolved gas concentration of second liquid 510 are substantially constant during application of acoustical energy to component part 502.

To attain a constant dissolved concentration in both first liquid 508 and second liquid 510, the flow rates of first liquid 508 and second liquid 510 are balanced and continuously circulated through inner channel 504 and external channel 506. As shown in FIG. 5, first liquid 508 flows through inner conduit 504 in a direction 518. First liquid 508 transfers the at least one component 502 through inner conduit 506 from first end 526 to second end 528. Second liquid 510 flows through external conduit 506 in a direction 520 from first end 530 to second end 532. Although FIG. 5 illustrates first liquid 508 flowing in direction 518 and second liquid 510 flowing in direction 520, one skilled in the art should recognize that liquid 508 and liquid 510 can flow in a direction opposite of directions 518 and 520. It also should be recognized that first liquid 508 could flow in a direction opposite of second liquid 510.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, various gases, gas concentrations, liquid flow rates, power, temperatures, acoustic energies, acoustic frequencies, waveforms, or signal characteristics may vary depending on the particular application for the cleaning device while maintaining substantially the same functionality without departing from the scope and spirit of the present invention. In addition, although the preferred embodiment described herein is directed to a cleaning device and liquid system for cleaning objects from a variety of industries, it will be appreciated by those skilled in the art that the teachings of the present invention can be applied to other systems, without departing from the scope and spirit of the present invention.

What is claimed is:

1. A cleaning device for cleaning at least one object comprising:
    an inner vessel containing a first liquid;
    an external vessel containing a second liquid and the inner vessel, wherein the second liquid is acoustically coupled to the first liquid; and
    at least one transducer acoustically coupled to the external vessel and configured to generate acoustical energy which is transferred to the object;
    wherein the first liquid has a first dissolved gas concentration of a first gas and the second liquid has a second dissolved gas concentration of a second gas, the first dissolved gas concentration is different than the second dissolved gas concentration.

2. The cleaning device of claim 1, wherein the at least one transducer acoustically operates in one of an ultrasonic frequency and a megasonic frequency.

3. The cleaning device of claim 1, wherein the first liquid and the second liquid comprise water.

4. The cleaning device of claim 1, wherein the first gas and the second gas comprise air.

5. The cleaning device of claim 1, wherein the dissolved gas concentration of the first gas in the first liquid and the dissolved gas concentration of the second gas in the second liquid is substantially constant during application of the acoustic energy to the object.

6. The cleaning device of claim 1, wherein the first dissolved gas concentration is greater than the second dissolved gas concentration.

7. The cleaning device of claim 1, wherein the first liquid is at a first temperature and the second liquid is at a second temperature.

8. The cleaning device of claim 1, wherein the first liquid is at a first flow rate and the second liquid is at a second flow rate.

9. The cleaning device of claim 1, wherein the inner vessel is an inner tank having an open top end and the external vessel is an external tank having an open top end.

10. The cleaning device of claim 1, wherein the inner vessel is an inner conduit having a first inner end and a second inner end and includes the first liquid having a first fluid flow, the first fluid flow transfers the object from the first inner end to the second inner end; and wherein the external vessel is an external conduit having a first external end and a second external end and includes the second liquid having a second fluid flow, the second fluid flow flows from the first end to the second end.

11. The cleaning device of claim 1, wherein the inner vessel is an open top inner channel having a first inner end and a second inner end and includes the first liquid having a first fluid flow, the first fluid flow transfers the object from the first inner end to the second inner end; and wherein the external vessel is an open top external channel having a first external end and a second external end, the second fluid flow flows from the first external end to the second external end.

12. The cleaning device of claim 1, wherein the first gas and the second gas comprise nitrogen.

13. The cleaning device of claim 1, wherein the first liquid and the second liquid comprise a solvent.

14. A cleaning device for cleaning at least one object comprising:
    an inner vessel containing a first liquid;
    an external vessel containing a second liquid and the inner vessel, wherein the second liquid is acoustically coupled to the first liquid; and
    at least one transducer acoustically coupled to the external vessel and configured to generate acoustical energy which is transferred to the object;
    wherein the first liquid has a dissolved gas concentration of a first gas that is greater than a dissolved gas concentration of a second gas in the second liquid.

15. The cleaning device of claim 14, wherein the first liquid and the second liquid comprise water.

16. The cleaning device of claim 14, wherein the first gas and the second gas comprise air.

17. The cleaning device of claim 14, wherein the dissolved gas concentration of the first gas in the first liquid and the dissolved gas concentration of the second gas in the second liquid is substantially constant during application of the acoustic energy to the object.

18. The cleaning device of claim 14, wherein the inner vessel is an inner tank having an open top end and the external vessel is an external tank having an open top end.

19. The cleaning device of claim 14, wherein the inner vessel is an inner conduit having a first inner end and a second inner end and includes the first liquid having a first fluid flow, the first fluid flow transfers the object from the first inner end to the second inner end; and wherein the external vessel is an external conduit having a first external end and a second external end and includes the second liquid having a second fluid flow, the second fluid flow flows from the first end to the second end.

20. The cleaning device of claim 14, wherein the inner vessel is an open top inner channel having a first inner end and a second inner end and includes the first liquid having a first fluid flow, the first fluid flow transfers the object from the first inner end to the second inner end; and wherein the external vessel is an open top external channel having; a first external end and a second external end and includes the second liquid having a second fluid flow, the second fluid flow flows from the first external end to the second external end.

21. A cleaning device for cleaning at least one object comprising:

an inner vessel having a first inner end and a second inner end and configured to contain a first liquid having a first fluid flow rate and the object, the first fluid flow rate configured to transfer the object from the first inner end to the second inner end;

an external vessel having a first external end and a second external end and configured to contain a second liquid having a second fluid flow rate and the inner vessel, wherein the second liquid is acoustically coupled to the first liquid and the second fluid flow flows from the first external end to the second external end; and at least one transducer acoustically coupled to the external vessel and configured to generate acoustical energy which is transferred to the object;

wherein the first liquid has a first dissolved gas concentration of a first gas and the second liquid has a second dissolved gas concentration of a second gas, the first dissolved gas concentration is different than the second dissolved gas concentration.

22. The cleaning device of claim 21, wherein the inner vessel comprises an inner conduit and wherein the external vessel comprises an external conduit.

23. The cleaning device of claim 21, wherein the inner vessel comprises an open top inner channel and wherein the external vessel comprises an open top external channel.

24. The cleaning device of claim 21, wherein the dissolved gas concentration of the first gas in the first liquid and the dissolved gas concentration of the second gas in the second liquid is substantially constant during application of the acoustic energy to the object.

25. The cleaning device of claim 21, wherein the first dissolved gas concentration is greater than the second dissolved gas concentration.

26. The cleaning device of claim 21, wherein the first fluid flow rate is different than the second fluid flow rate.

\* \* \* \* \*